United States Patent
Wu et al.

(10) Patent No.: US 9,581,638 B2
(45) Date of Patent: Feb. 28, 2017

(54) CHIP-ON-WAFER PROCESS CONTROL MONITORING FOR CHIP-ON-WAFER-ON-SUBSTRATE PACKAGES

(71) Applicant: Taiwan Semiconductor Manufacturing Company, Ltd., Hsin-Chu (TW)

(72) Inventors: Wei-Cheng Wu, Hsin-Chu (TW); Li-Han Hsu, Hsin-Chu (TW); Sao-Ling Chiu, Hsin-Chu (TW); Shang-Yun Hou, Jubei (TW); Shin-Puu Jeng, Hsin-Chu (TW); Chen-Hua Lin, Douliu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 246 days.

(21) Appl. No.: 13/905,958

(22) Filed: May 30, 2013

(65) Prior Publication Data
US 2014/0266283 A1    Sep. 18, 2014

Related U.S. Application Data

(60) Provisional application No. 61/780,759, filed on Mar. 13, 2013.

(51) Int. Cl.
*G01R 31/26* (2014.01)
*G01R 31/28* (2006.01)

(52) U.S. Cl.
CPC ................. *G01R 31/2884* (2013.01)

(58) Field of Classification Search
CPC ............ G01R 31/2607; G01R 31/2884; G01R 31/2601; G01R 31/2642; G01R 31/3187; G01R 31/2812; G01R 31/2853
USPC ................... 324/756.03, 762.05, 750.3, 500, 512,324/522, 527, 73.1
See application file for complete search history.

(56) References Cited

U.S. PATENT DOCUMENTS

| | | | |
|---|---|---|---|
| 5,199,889 A * | 4/1993 | McDevitt, Jr. ................. 439/66 |
| 5,828,223 A * | 10/1998 | Rabkin .............. G01R 31/2887 324/750.19 |
| 6,564,986 B1 * | 5/2003 | Hsieh ............................ 228/103 |
| 7,141,996 B2 * | 11/2006 | Chang ................ G01R 1/07378 324/754.03 |
| 7,279,795 B2 * | 10/2007 | Periaman ............ H01L 25/0657 257/772 |
| 7,576,435 B2 * | 8/2009 | Chao ................. H01L 23/49816 257/774 |
| 7,642,800 B2 * | 1/2010 | Ku et al. .................... 324/750.3 |
| 8,378,700 B2 * | 2/2013 | Watanabe et al. ....... 324/754.07 |
| 2003/0076125 A1 * | 4/2003 | McCord ......... G01R 31/318505 324/754.07 |
| 2010/0117673 A1 * | 5/2010 | Lee .................... G01R 31/2889 324/756.03 |

(Continued)

*Primary Examiner* — Minh N Tang
*Assistant Examiner* — David Frederiksen
(74) *Attorney, Agent, or Firm* — Slater Matsil, LLP

(57) ABSTRACT

An embodiment method includes providing a standardized testing structure design for a chip-on-wafer (CoW) structure, wherein the standardized testing structure design comprises placing a testing structure in a pre-selected area a top die in the CoW structure, and electrically testing a plurality of microbumps in the CoW structure by applying a universal testing probe card to the testing structure.

19 Claims, 3 Drawing Sheets

(56) References Cited

U.S. PATENT DOCUMENTS

| | | | |
|---|---|---|---|
| 2012/0168964 A1* | 7/2012 | Kim | G01R 1/07307 257/777 |
| 2012/0206160 A1* | 8/2012 | Wu | G01R 31/2884 324/756.07 |
| 2012/0212247 A1* | 8/2012 | Sakata | G01R 31/2889 324/754.03 |
| 2012/0246514 A1* | 9/2012 | Chen | G01R 31/318371 714/32 |
| 2014/0051189 A1* | 2/2014 | Kai-Jun et al. | 438/15 |
| 2014/0091819 A1* | 4/2014 | Gong et al. | 324/750.3 |
| 2014/0183748 A1* | 7/2014 | Ooi | H01L 24/03 257/773 |
| 2014/0189456 A1* | 7/2014 | Loh | G01R 31/2812 714/733 |

* cited by examiner

CHIP-ON-WAFER PROCESS CONTROL MONITORING FOR CHIP-ON-WAFER-ON-SUBSTRATE PACKAGES

This application claims the benefit of U.S. Provisional Application No. 61/780,759, filed on Mar. 13, 2013, entitled "Chip-on-Wafer Process Control Monitoring for Chip-on-Wafer-on-Substrate Packages," which application is hereby incorporated herein by reference.

BACKGROUND

As semiconductor technologies evolve, three dimensional (3D) integrated circuits (ICs) emerge as an effective alternative to further reduce the physical size of a semiconductor chip. One form of 3D IC is a chip-on-wafer-on-substrate (CoWoS) package. In a CoWoS package, a variety of chips comprising active circuits are first attached to an interposer wafer using micro-bumps (μbumps) to form a chip-on-wafer (CoW) structure. The variety of chips may be interconnected using through silicon vias (TSVs) in the interposer wafer. The CoW structure may then be attached to a substrate to form the completed CoWoS package. Typically, a CoWoS package allows for higher yield, higher connection densities, smaller form factors, and increased cost-effectiveness. A CoWoS package also allows for improved connections between the chip and the interposer wafer compared to other 3D IC packages (e.g., packages wherein the interposer wafer is first attached to the substrate before the variety of chips are attached).

As part of the CoW formation process, the number of μbumps used to connect the chip to the interposer wafer may number in the tens of thousands. A bad connection in any one of these μbumps may cause the entire packaged device to fail. Therefore, testing the interconnection quality of the CoW structure is an important aspect of the CoWoS packaging process. Currently, two types of CoW connection testing methods may be used: physical examination (e.g., a sampling of chips are x-rayed and examined manually) or product chip probing (CP).

Physical examination CoW testing may be unreliable and time-consuming. For example, a given wafer may include a hundred or more chips, and there may be twenty-five or more wafers in a lot. Furthermore, it may take a human twelve minutes or more to inspect a chip for bad connections. It is physically unrealistic to examine every chip in a lot; therefore, only a sampling of chips are examined (e.g., as few as five chips/wafer and one wafer/lot may be randomly sampled and examined). This low sampling rate restriction results in unreliable testing results, but sampling rates are not easily increased due to the time-consuming nature of the testing process. The unreliable nature of physical examination CoW testing may also be exacerbated by human error and limitations in the type of detectable connection failures (e.g., only bridged connections are readily visible, but other connection failures, such as voids, may still be present).

Product CP CoW testing involves functionally testing the electrical connections between the chip and the wafer. While this type of testing is less time consuming and more reliable than physical examination, product CP testing is inherently costly due to its chip-specific nature. That is, chip testing designs and testing probes are specific to a particular chip layout. Active circuits in a chip must be rerouted to peripheral regions of the interposer wafer to provide access for a testing probe to perform functional tests. This rerouting pattern is dependent on the circuit layout of a chip; therefore product CP testing creates an added cost for each chip and does not allow for standardized testing procedures.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely chip-on-wafer (CoW) process control monitoring for a chip-on-wafer-on-substrate (CoWoS) package. Other embodiments may also be applied, however, to other chip or packaging structures using interconnect bumps (e.g., μbumps, controlled collapse chip connection (C4s), ball grid arrays (BGAs), and the like) as connectors. For example, other embodiments may be applied to flip-chip packaging, wafer-level chip-scale packaging (CSP), package-on-package (POP) packaging, and the like.

Figure 1:
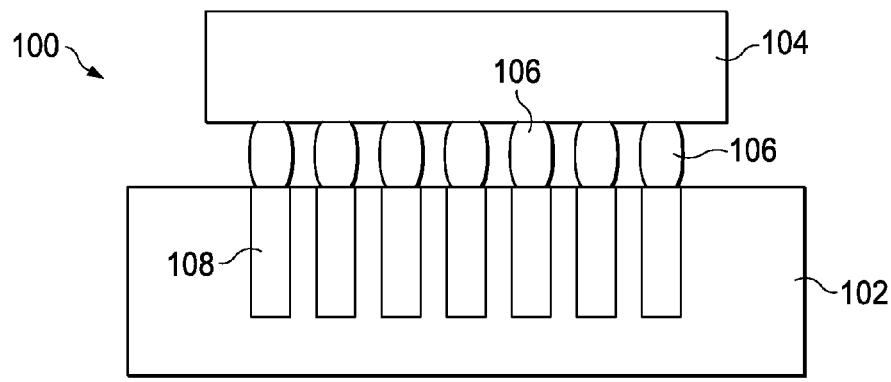
FIG. 1 is a cross-sectional view of a typical chip-on-wafer (CoW) structure.

With reference now to FIG. 1, there is shown a cross-sectional representation of a chip-on-wafer (CoW) structure 100, which may be used to form a chip-on-wafer-on-substrate (CoWoS) package. CoW structure 100 includes a bottom die 102 connected to a top die 104 through a multitude of micro-bumps (μbumps) 106. Top die 104 may be a chip comprising functional, active circuits (not shown). Bottom die 102 may be an interposer wafer, which may or may not include functional circuits. Bottom die 102 may include a plurality of through silicon-vias (TSVs) 108. Active circuits in top die 104 may be interconnected using TSVs 108. For ease of illustration, FIG. 1 illustrates CoW 100 as only having seven μbumps; however, in reality CoW 100 may have tens of thousands of μbumps connecting top die 104 to bottom wafer 102.

Various embodiments allow for standardized, reliable resting of CoW structures by providing a design with test structures for inclusion in a pre-selected area of a top die of the CoW structure. A pre-selected area may be a sensitive area of the top die that is most susceptible to connection issues (e.g., corner regions of the top die where connection stress may have the most impact). Furthermore, the test structure design is a standard design that may be included in a variety of different top dies and is not dependent on the chip layout of various components in the different top dies. That is, the same test structure design may be used in a variety of CoW top dies and may therefore be referred to as a standardized test structure design.

The standardized test structure design may be incorporated and implemented into the layout of the top die, and the top die may be attached to the bottom die to form a CoW structure having standardized test structures. Electrical testing is performed on microbump connections of the CoW structure having standardized test structures. Subsequently, if the CoW structure passes the electrical test, it may be attached to a substrate to create a chip-on-wafer-on-substrate (CoWoS) package having known reliable connections between the active chip and the interposer wafer (i.e., the top and bottom dies).

Figure 2A:
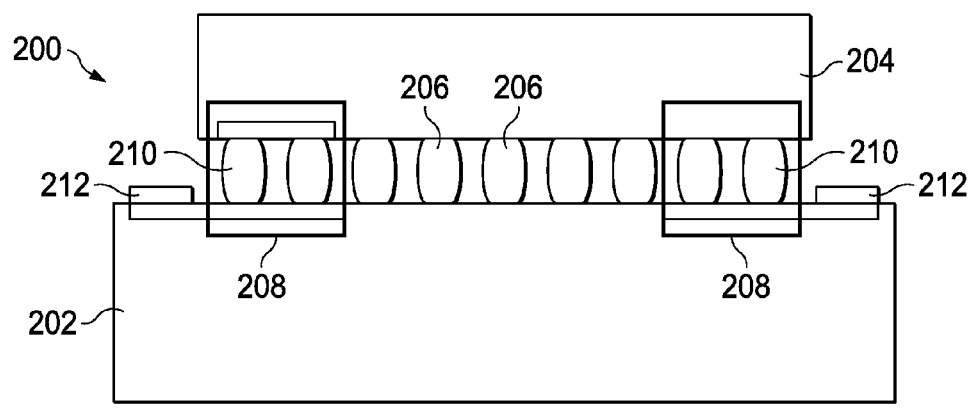
FIGS. 2A-2C are varying views of a CoW structure including standardized testing structures in accordance with various embodiments.

FIG. 2A illustrates a cross-sectional view of a CoW structure 200 including standardized test structures in accordance with various embodiments. CoW structure 200 includes bottom die 202 attached to top die 204 through a plurality of μbumps 206. Bottom die 202, top die 204, and μbumps 206 may be substantially similar to bottom die 102, top die 104, and μbumps 106 in FIG. 1.

CoW structure 200 includes testing structures 208 electrically connected to probing pads 212. Testing structures 208 may be referred to as standardized testing structures because they are able to be included in a variety CoW structures regardless of the layout the components (not shown) in top dies 204. For example, a sample IC layout including guidelines and design rules for inserting standardized testing structures 208 may be provided for inclusion in designing the layout of top die 204. Standardized testing structures 208 includes a plurality of microbumps 210, which may be configured in different patterns to allow for various physical measurement tests on the connection quality between top die 204 and bottom die 202.

Figure 2B:
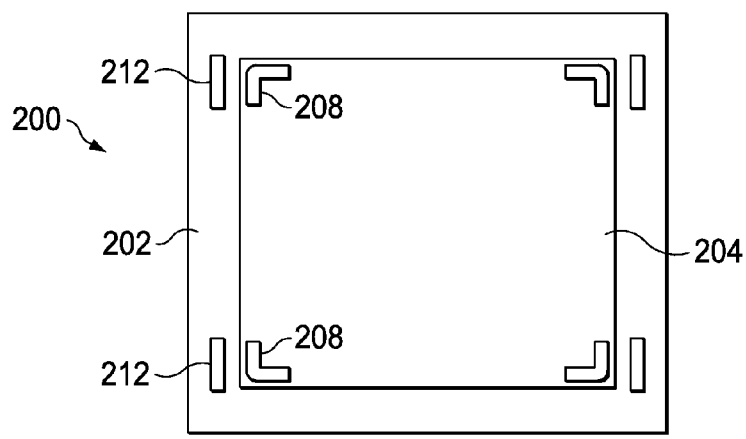

Standardized testing structures 208 are disposed in preselected areas of CoW structure 200. For example, FIG. 2B illustrates a top-down view of CoW structure 200 with standardized testing structures 208 disposed in corners regions of CoW structure 200. Corner regions of a die are high-stress regions, which may be relatively susceptible to connection issues compared to other regions of a die. Therefore, by placing testing structures in these pre-selected, regions (e.g., high-stress corner regions), the connection quality of all μbumps 206 may be extrapolated. Although FIG. 2B illustrates standardized testing structures as disposed in corner regions of CoW structure 200, alternative embodiments include standardized testing structures 208 being placed in other regions of CoW structure 200. For example, standardized testing structures 208 may also be placed in center regions of top die 204 instead of or in addition to corner regions.

Various embodiments perform electronic testing of CoW structure 200 through standardized testing structures 208 disposed in pre-selected areas of CoW structure 200 instead of performing full functional tests. Thus, the size of standardized testing structures 208 may be kept relatively small, and standardized testing structures 208 may be inserted in a variety of layouts without the need for complex rerouting or redesign of functional components in top die 204. Furthermore, when testing structures 208 are placed in corner regions of CoW structure 200, electrical routing to probing pads 212 may be minimized due to the close proximity of corner regions to peripheral regions of bottom die 202.

Standardized testing structures 208 may be configured in any shape. For example, FIG. 3 illustrates standardized testing structures 208 as having an L-shape to fully test the corner region of CoW structure 200. Alternative embodiments include standardized testing structures 208 having different shapes such as a straight line, a rectangle, a square, a circle, a border around peripheral regions of top die 204, or the like.

Figure 2C:
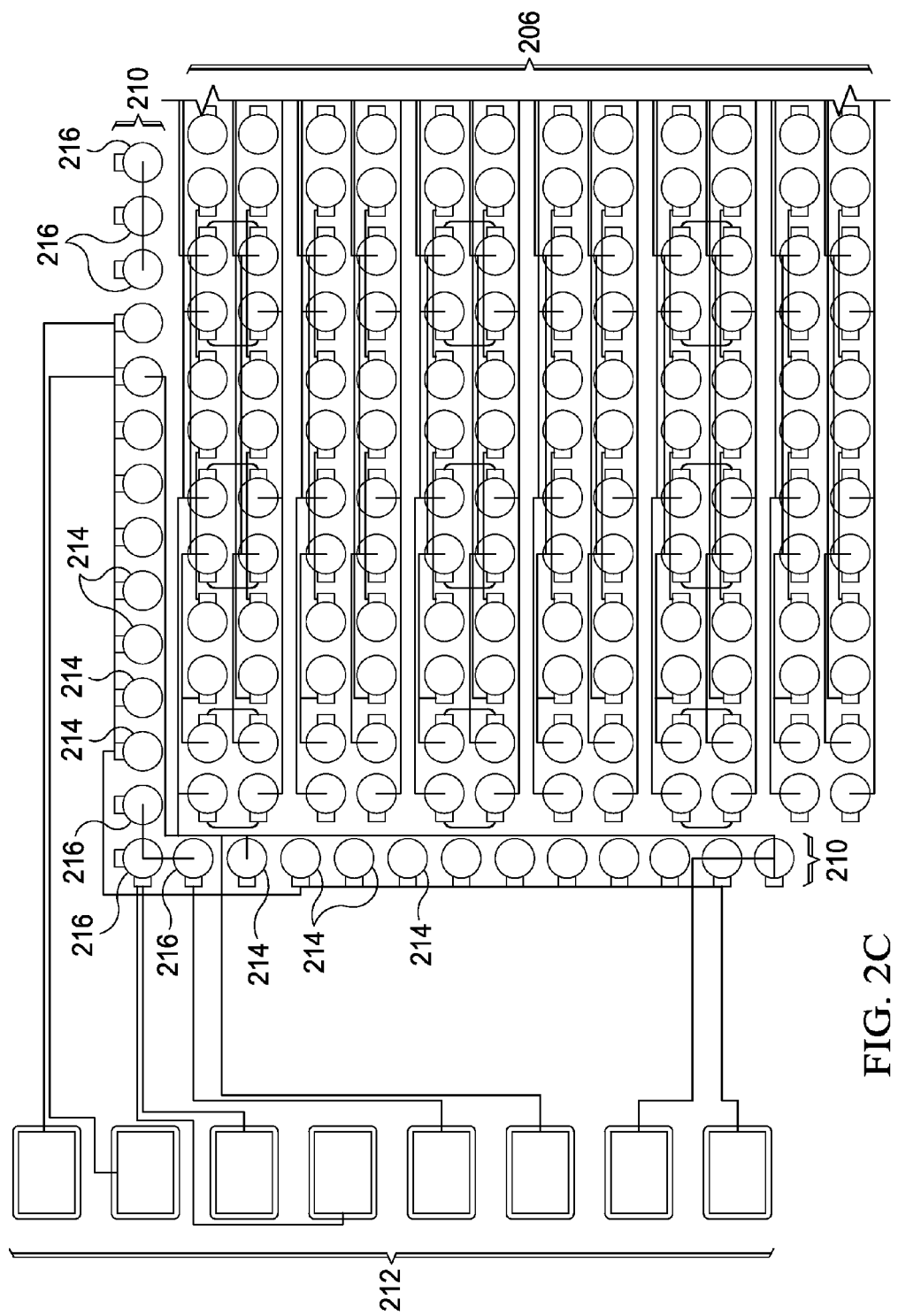

Standardized testing structures 208 include a plurality of μbumps 210, which may also be referred to as test bumps 210. Test bumps 210 may be configured in various physical measurement patterns to enable electrical testing of the connection quality of top die 204 to bottom die 202. For example, FIG. 2C shows test bumps 210 being configured in daisy chains 214 (to test electrical continuity of μbumps connections) and kelvin structures 216 (to test the resistance of μbumps) electrically connected to probing pads 212. In various embodiments, test bumps 210 may be configured in any pattern including one or more daisy chains, one or more kelvin structures, other physical measurement patterns, or combinations thereof.

Standardized testing structures 208 are electrically connected to probing pads 212. As shown in FIGS. 2A-2B, probing pads 212 are located on the peripheral regions of bottom die 202. That is, probing pads 212 are not covered by top die 204, and may be accessed by a testing apparatus such as a testing probe card (not shown). Generally, testing probe cards may be used to perform electrical tests on structures in an IC structure. The configuration of testing probe cards is implementation specific and based on the structure to be tested. Because standardized testing structures 208 may be constant across a variety of CoW structures, various embodiments allow for a universal testing probe card to be used in CoW testing. That is, the same testing probe card configuration may be used to test a variety of CoW structures and reduces the need to configure CoW structure specific testing probe cards. For example, the number of probing tips and probe pitch of the universal testing probe card may be constant and used to test a variety of CoW structures.

Figure 3A:
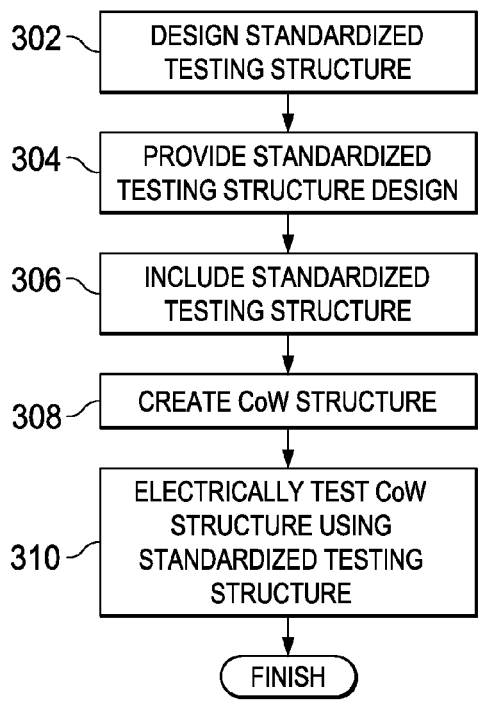
FIGS. 3A-3B are flow diagrams describing CoW testing in accordance with various embodiments.
Figure 3B:
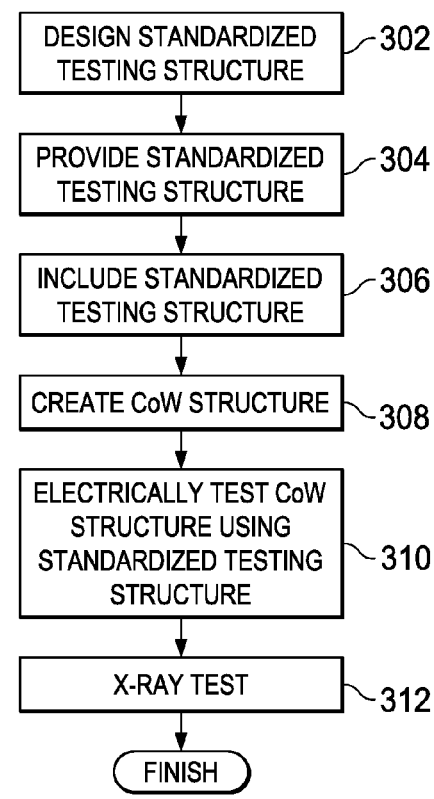

FIGS. 3A-3B illustrate flow diagrams for testing CoW structures in accordance with various embodiments. In step 302, standardized testing structures are designed for implementation in CoW structures. The standardized testing structures design may provide for test bumps configured in various physical measurement patterns such as daisy chains, kelvin structures, and the like. Furthermore, the standardized testing structures designs may provide for standardized testing structures to be disposed in various pre-selected regions of a CoW structure (e.g., sensitive corner regions of a top die). The standardized testing structure design may be included in a variety of CoW structures regardless of the layout of other components (e.g., active circuits) of a top die in the CoW structure.

In step 304, the standardized testing structure design is provided to various chip designers for inclusion in a CoW structure. The standardized testing structure design may include a sample IC layout (e.g., a GDS file) and/or design rules/guidelines for including the standardized testing structure in a CoW structure.

In step 306, a CoW structure is created. Specifically, a top die including physical implementations of the standardized testing structure design disposed in pre-selected regions is attached to a bottom die through a multitude of μbumps. The top die may be a chip including active circuits, while the bottom die may be an interposer wafer. The standardized testing structures include test bumps electrically connected to probing pads located on the peripheral regions of the bottom die.

In step 310, electrical tests are performed on the connection quality of μbumps in the CoW structure via the standardized testing structure. For example, a universal testing probe card may be applied to the probing pads to test the connection quality of the various standardized testing structures. After step 310, manual x-ray examination of various connections in the CoW structure may optionally be performed to ensure connection quality between the top and bottom dies (illustrated in as step 312 in FIG. 3B). Subsequently, the CoW structure may undergo further CoWoS process steps and eventually attached to a suitable substrate to form a CoWoS package.

In accordance with an embodiment, a method for testing a chip-on-wafer (CoW) structure includes providing a standard testing structure design for a CoW structure. The standardized testing structure design includes placing a testing structure in a pre-selected area of a top die in the CoW structure and electrically testing a plurality of microbumps in the CoW structure by applying a universal testing probe card to the testing structure.

In accordance with another embodiment, a method for testing a chip-on-wafer (CoW) structure includes designing a plurality of standardized testing structures for placement in pre-selected regions of a CoW structure. The standardized testing structures are electrically connected to a plurality of probing pads for placement on peripheral regions of a bottom die of the CoW structure. The method further includes electrically testing microbump connections of a plurality of CoW structures, wherein the plurality of CoW structures each include an implementation of the plurality of standardized testing structures electrically connected to the plurality of probing pads.

In accordance with yet another embodiment, a chip-on-wafer (CoW) testing mechanism includes a standardized testing structure configured to be placed in a pre-selected region of a top die of a CoW structure, and a probing pad configured to be placed in a peripheral region of a bottom die of the CoW structure and electronically connected to the standardized testing structure.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for testing a chip-on-wafer (CoW) structure comprising:
    providing a standardized testing structure design for a CoW structure, wherein the standardized testing structure design comprises placing a testing structure in a pre-selected area within a top die in the CoW structure, wherein the top die comprises functional circuits independent from and formed on a same substrate as the testing structure, wherein the testing structure has a same circuit layout as an additional testing structure within an additional top die of an additional CoW structure, and wherein the additional top die comprises additional functional circuits having a different circuit layout than the functional circuits of the top die; and
    electrically testing a plurality of microbumps between the top die and another die in the CoW structure by applying a universal testing probe card to transmit an electrical signal through the testing structure, wherein a same electrical signal is sent through the additional testing structure as the electrical signal when electrically testing the additional CoW structure.

2. The method of claim 1, wherein:
    providing the standardized testing structure design further includes placing a probing pad on a peripheral region of a bottom die of the CoW structure and electrically connected to the testing structure; and
    electrically testing the plurality of microbumps comprises applying the universal testing probe card to the testing structure through the probing pad.

3. The method of claim 1, wherein placing the testing structure in the pre-selected area of the CoW structure comprises placing the testing structure in a center region of the top die.

4. The method of claim 1, wherein placing the testing structure in the pre-selected area of the CoW structure comprises placing the testing structure in a corner region of the top die.

5. The method of claim 1, further comprising, after electrically testing the plurality of microbumps, physically examining a sample of the plurality of microbumps using an x-ray.

6. The method of claim 1, wherein providing the standardized testing structure design further comprises including a daisy chain in the testing structure.

7. The method of claim 1, wherein providing the standardized testing structure design further comprises including a kelvin structure in the testing structure.

8. The method of claim 1, wherein providing the standardized testing structure design further comprises configuring the testing structure in an L-shape.

9. The method of claim 1, wherein the testing structure comprises a plurality of electrically interconnected conductive lines electrically connected to microbumps bonding the top die to the another die, wherein the additional testing structure further comprises an additional plurality of electrically interconnected conductive lines, and wherein a layout of the plurality of electrically interconnected conductive lines is the same as a layout of the additional plurality of electrically interconnected conductive lines.

10. A method for testing a chip-on-wafer (CoW) structure comprising:
    designing, by a processor, a plurality of standardized testing structures for placement in pre-selected regions of a CoW structure;
    forming a plurality of CoW structures, wherein each of the plurality of CoW structures include:
        a top die comprising:
            the plurality of standardized testing structures, wherein the plurality of standardized testing structures comprise a same circuit layout in different ones of the plurality of CoW structures; and
            additional functional circuits independent from the plurality of standardized testing structures, wherein the additional functional circuits comprise different circuit layouts in the different ones of the plurality of CoW structures; and
        a bottom die bonded to the top die by microbump connections, wherein the plurality of standardized testing structures are electrically connected to a plurality of probing pads disposed in peripheral regions of the bottom die; and electrically testing the microbump connections of the plurality of CoW structures by transmitting a same electrical signal through each of the plurality of CoW structures.

11. The method of claim 10, wherein electrically testing the microbump connections of the plurality of CoW structures comprises applying a universal testing probe card to the plurality of probing pads in each of the plurality of CoW structures, wherein the universal testing probe card is configured to test a variety of different CoW structures having different chip layouts.

12. The method of claim 10, wherein the pre-selected regions of the CoW structure are corner regions of a top die in the CoW structure.

13. The method of claim 10, wherein the pre-selected regions of the CoW structure are center regions of a top die in the CoW structure.

14. A chip-on-wafer (CoW) testing mechanism comprising:
a standardized testing structure configured to be placed in a pre-selected region within a top die of a CoW structure, wherein the standardized testing structure comprises microbumps and a plurality of electrically interconnected conductive lines in the top die and electrically connected to the microbumps; wherein the top die further comprises functional circuits independent from and formed on a same substrate as the standardized testing structure, wherein additional standardized testing structures having a same circuit layout as the standardized testing structure are configured to be placed in a variety of top dies of a variety of CoW structures, wherein the variety of top dies each comprise a different functional circuit layout, wherein each of the additional standardized testing structure comprises:
additional microbumps; and
an additional plurality of electrically interconnected conductive lines in a respective one of the variety of top dies and electrically connected to the additional microbumps, and wherein the plurality of electrically interconnected conductive lines has a same layout as the additional plurality of electrically interconnected conductive lines; and
a probing pad configured to be placed in a peripheral region of a bottom die of the CoW structure and electronically connected to the standardized testing structure.

15. The CoW testing mechanism of claim 14, wherein the standardized testing structure includes a first daisy chain at a first location in the top die, wherein the additional standardized testing structure includes a second daisy chain having a same layout as the first daisy chain, and wherein the second daisy chain is disposed in a same relative location in each of the variety of top dies as the first location.

16. The CoW testing mechanism of claim 14, wherein the standardized testing structure includes a first kelvin structure at a second location in the top die, wherein the additional standardized testing structure includes a second kelvin structure having a same layout as the first kelvin structure, and wherein the second kelvin structure is disposed in a same relative location in each of the variety of top dies as the second location.

17. The CoW testing mechanism of claim 14, wherein the standardized testing structure has an L-shape.

18. The CoW testing mechanism of claim 14, wherein the top die is an active device die and the bottom die is an interposer.

19. The CoW testing mechanism of claim 14, wherein the bottom die comprises contact pads contacting the microbumps, wherein the probing pad is located on a same surface of the bottom die as the contact pads, and wherein the probing pad is exposed when the top die is bonded to the bottom die.

* * * * *